United States Patent
Marx et al.

(10) Patent No.: US 9,822,439 B2
(45) Date of Patent: Nov. 21, 2017

(54) DEPOSITION SYSTEMS AND METHODS

(71) Applicant: FLIR Systems, Inc., Wilsonville, OR (US)

(72) Inventors: Tommy Marx, Santa Barbara, CA (US); Richard E. Bornfreund, Santa Barbara, CA (US); Yaroslava Petraitis, Ventura, CA (US); James L. Dale, Santa Barbara, CA (US)

(73) Assignee: FLIR Systems, Inc., Wilsonville, OR (US)

( * ) Notice: Subject to any disclaimer, the term of this patent is extended or adjusted under 35 U.S.C. 154(b) by 0 days.

(21) Appl. No.: 14/745,246

(22) Filed: Jun. 19, 2015

(65) Prior Publication Data

US 2015/0284838 A1 Oct. 8, 2015

Related U.S. Application Data

(63) Continuation of application No. PCT/US2013/077630, filed on Dec. 23, 2013.

(60) Provisional application No. 61/746,495, filed on Dec. 27, 2012.

(51) Int. Cl.
*C23C 14/00* (2006.01)
*H01J 37/34* (2006.01)
*C23C 14/08* (2006.01)
*C23C 14/34* (2006.01)

(52) U.S. Cl.
CPC ...... *C23C 14/0042* (2013.01); *C23C 14/0063* (2013.01); *C23C 14/08* (2013.01); *C23C 14/083* (2013.01); *C23C 14/3485* (2013.01); *H01J 37/3411* (2013.01); *H01J 37/3429* (2013.01);

(Continued)

(58) Field of Classification Search
CPC .................................................. H01J 37/3411
See application file for complete search history.

(56) References Cited

U.S. PATENT DOCUMENTS

| 4,780,190 A | 10/1988 | Vranken et al. |
| 5,556,520 A | 9/1996 | Latz |

(Continued)

FOREIGN PATENT DOCUMENTS

| JP | H08176813 | 7/1996 |
| JP | 2000321124 | 11/2000 |

OTHER PUBLICATIONS

Lou et al., "Closed Loop Controlled Reactive Dual Magnetron Sputtering", publication, 1999, 4 pages, White Papers Reference Library, Advanced Energy, Fort Collins/US http://www.advanced-energy.com/upload/File/White_Papers/SL-WHITE10-270-01.pdf.

(Continued)

*Primary Examiner* — Timon Wanga
(74) *Attorney, Agent, or Firm* — Haynes and Boone, LLP

(57) ABSTRACT

A system is disclosed, including a processing chamber for a deposition process; a cathode within the chamber, configured to introduce a sputter gas and a reactive gas adjacent to a target; a substrate holder, disposed opposite the cathode within the processing chamber, configured to secure a substrate to receive a deposition from the target; and a control system configured to monitor a target voltage and to control a flow rate of the reactive gas to maintain the target voltage within a desired range during the deposition process. Methods and devices for deposition processes are also disclosed.

22 Claims, 4 Drawing Sheets

(52) U.S. Cl.
CPC ... *H01J 37/3467* (2013.01); *H01J 2237/3323* (2013.01)

(56) References Cited

U.S. PATENT DOCUMENTS

| | | | |
|---|---|---|---|
| 6,451,184 B1* | 9/2002 | Sone | C23C 14/0057 204/298.06 |
| 2003/0062255 A1 | 4/2003 | Haag et al. | |
| 2003/0192778 A1* | 10/2003 | Yamaguchi | C23C 14/355 204/192.12 |
| 2005/0011756 A1 | 1/2005 | Shibamoto et al. | |
| 2005/0178654 A1* | 8/2005 | Chistyakov | C23C 14/228 204/192.12 |
| 2005/0272254 A1* | 12/2005 | Ding | C23C 14/0641 438/628 |
| 2007/0158186 A1* | 7/2007 | Yi | C23C 14/0063 204/298.01 |
| 2009/0134010 A1* | 5/2009 | Shibamoto | C23C 14/34 204/192.1 |
| 2009/0273087 A1 | 11/2009 | French et al. | |
| 2011/0303960 A1* | 12/2011 | Cao | C23C 14/165 257/315 |

OTHER PUBLICATIONS

Fieldhouse et al., "Electrical properties of vanadium oxide thin films for bolometer applications: processed by pulse dc sputtering", Journal of Physics D: Applied Physics, Mar. 7, 2009, 8 pages, vol. 42, No. 5, Institute of Physics Publishing Ltd, Great Britain.

* cited by examiner

DEPOSITION SYSTEMS AND METHODS

CROSS REFERENCE TO RELATED APPLICATION

This application is a continuation of U.S. International Patent Application No. PCT/US2013/77630 filed Dec. 23, 2013 and entitled "DEPOSITION SYSTEMS AND METHODS".

U.S. International Patent Application No. PCT/US2013/77630 claims the benefit of U.S. Provisional Patent Application No. 61/746,495 filed Dec. 27, 2012 and entitled "DEPOSITION SYSTEMS AND METHODS" which are both hereby incorporated by reference in their entirety.

TECHNICAL FIELD

One or more embodiments of the invention relate generally to processes for depositing thin films onto a substrate, and more particularly to improved deposition systems, methods, and devices.

BACKGROUND

In many fields of technology, thin film processes are utilized in the fabrication, refinement, and finishing of a vast number of devices and further components. Examples come from the fields of electronic and electrical devices, integrated circuits, micromechanical devices, physical, chemical and biological sensors, optical components, mechanical components and many more fields of application. In many of these and other examples, a deposition of a film, for instance a thin film with a thickness of typically 1 µm or less is deposited by a deposition technique, such as a physical vapor deposition process (PVD). An important physical vapor deposition process is the sputter deposition technique, which is sometimes also referred to as sputtering.

In sputtering, high-energy particles strike a target and physically dislodge atoms. These sputtered atoms migrate through a vacuum and eventually are deposited on a substrate, e.g., a wafer.

In reactive sputtering, a film is formed by chemical reaction between the target material and a gas that is introduced into the vacuum chamber is deposited on the wafer. Oxide and nitride films are often fabricated using reactive sputtering.

Some reactive deposition processes, however, have narrow process windows that result in poor wafer uniformity and repeatability issues (e.g., for the deposition of vanadium oxide films, such as for the manufacture of microbolometers). As a result, there is a need for improved deposition methods, systems, and devices that enhance wafer uniformity and repeatability.

SUMMARY

The present disclosure provides for various advantageous deposition systems, devices, and methods, in accordance with one or more embodiments. For example, in accordance with an embodiment, a system includes a processing chamber for a deposition process; a cathode within the processing chamber, configured to introduce a sputter gas and a reactive gas adjacent to a target; a substrate holder, disposed opposite the cathode within the processing chamber, configured to secure a substrate to receive a deposition from the target; and a control system configured to monitor a target voltage and to control a flow rate of the reactive gas to maintain the target voltage within a desired range during the deposition process. In one or more embodiments, the substrate holder and/or substrate is at a different electrical potential than the cathode.

In accordance with another embodiment of the present disclosure, a device includes gas inlets to receive a sputter gas and a reactive gas; and gas channels operatively associated with the gas inlets to distribute the sputter gas and the reactive gas at two or more side surfaces (and/or along the outer edge) and a center surface of a target for a deposition process.

In accordance with yet another embodiment of the present disclosure, a method includes introducing via a cathode within a processing chamber a sputter gas and a reactive gas adjacent to a target, wherein the cathode is in close proximity to the target; creating a plasma at the target; activating the target, causing particles to be emitted from the target; forming a product from a reaction of the target particles with the reactive gas; and depositing the product on the substrate.

The scope of the disclosure is defined by the claims, which are incorporated into this section by reference. A more complete understanding of embodiments of the present disclosure will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

Figure 1:
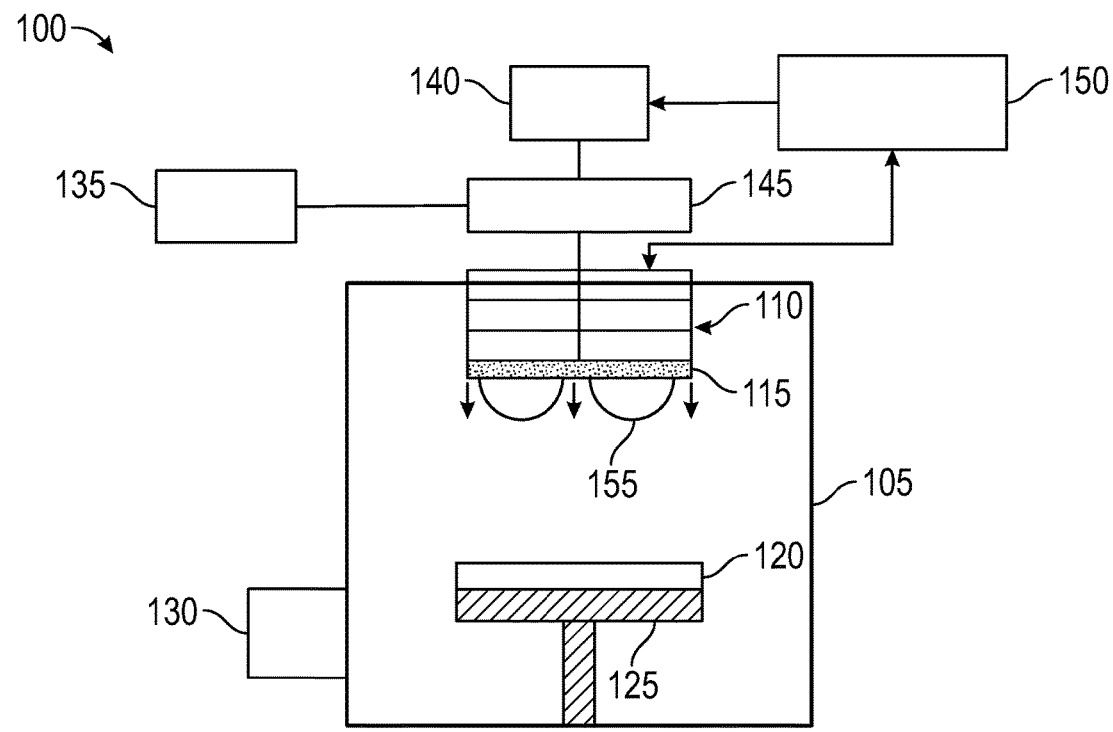
FIG. 1 illustrates a block diagram of a system in accordance with embodiments of the present disclosure.

FIG. 1 is a block diagram of an embodiment of a system 100 according to the present disclosure. The system 100 includes a processing chamber 105, a cathode 110, a target 115, a substrate 120, a substrate holder 125, a pump 130, a sputter gas flow controller 135, a reactive gas flow controller 140, a combined gas inlet 145, and a control system 150.

The processing chamber 105 encloses target 115 and substrate 120. Target 115 may be any metal suitable for use in a sputtering process. In one embodiment, target 115 includes a transition metal, such as vanadium (V), nickel (Ni), tungsten (W), manganese (Mn), titanium (Ti), chromium (Cr), molybdenum (Mo), niobium (Nb), and/or zirconium (Zr). In an exemplary embodiment, target 115 includes vanadium (V). In other examples and embodiments, target 115 includes a film-forming material such as aluminum (Al), copper (Cu), or silicon (Si). Substrate 120 may be a monocrystalline or a polycrystalline substrate made out of an insulating, semiconducting, metallic or conducting material. Its shape may be circular or oval, rectangular, quadratic or polygonal or any other desired shape. A circular substrate is often referred to as a wafer. The thickness of the substrate may vary between a few micrometers to several millimeters (e.g., about 4 mm).

Air in processing chamber 105 is substantially evacuated by pump 130 to keep the inside of processing chamber 105 at a desired atmosphere. In one embodiment, processing chamber 105 is a vacuum chamber. Pump 130 may be any suitable pump, such as a vacuum pump, e.g., turbopumps, mechanical pumps, and/or cryopumps. Pump 130 controls the partial pressure of reactive gas and sputter gas by pumping the gases out of processing chamber 105, and therefore can affect film uniformity. The partial pressure of each gas in processing chamber 105 can be modified based on the pumps used for a particular desired application.

Sputter gas, such as argon gas, is supplied to processing chamber 105 by, for example, a sputter gas inlet. A sputter gas supply system is mechanically coupled to the sputter gas inlet to supply system 100 with the sputter gas. Reactive gas, such as oxygen gas, is also supplied to processing chamber 105 by a reactive gas inlet. The sputter gas and reactive gas inlets may further include components to control, and/or regulate the gas flow. Hence, the gas inlets may include switchable valves, controllable valves, and/or flow controllers. As illustrated, the flow rate of the sputter gas is controlled by sputter gas flow controller 135, and the flow rate of the reactive gas is controlled by reactive gas flow controller 140. The two gases are fed into a combined inlet 145 for release in the vicinity of target 115 (e.g., via cathode 110). In a different embodiment, the two gases are fed into separate inlets for release into processing chamber 105 (e.g., via cathode 110).

Cathode 110 receives the gases (e.g., gas mixture) and distributes a plasma 155 of the gas mixture adjacent to target 115. Details of one embodiment of cathode 110 are provided further below. In one embodiment, plasma 155 is distributed in close proximity to two or more side surfaces and a center surface of target 115.

Cathode 110 may optionally include a magnet oriented to generate a magnetic field (DC magnetron configuration) inside processing chamber 105. The magnetic field acts to trap electrons in a desired region, i.e., in front of target 115, thus producing a region of high-density plasma. The end result of this set up is that more ions cause more sputtering of the target, which increases deposition rate.

Cathode 110 may also optionally include a cooling mechanism for cooling target 115 during sputtering. The heat generated during sputtering may be dissipated; otherwise for some applications it may damage target 115 and other components of cathode 110.

As illustrated, target 115 is mounted on cathode 110. To generate plasma, system 100 may for instance include a voltage source capable of providing a DC voltage, an AC voltage or a DC pulsed voltage to cathode 110. In one embodiment, control system 150 includes a power supply to provide voltage to cathode 110. In the case of a DC voltage applied to cathode 110, the sputtering process is referred to as a DC sputter deposition process. In RF (radio frequency) sputtering, an RF field is used to create the plasma. In DC pulsed voltage sputtering, a DC voltage is applied to cathode 110 with an inverted pulse occurring during the deposition cycle to remove localized charging on target 115.

Once the plasma is generated, positive sputter gas ions bombard target 115 and eject target atoms. The target atoms react with the reactive gas to form a reaction product, e.g., a metal oxide or metal nitride. In an exemplary embodiment, the reaction product includes vanadium pentaoxide. The reaction product travels from target 115 to substrate 120, which is mounted on substrate holder 125, and forms a thin film on substrate 120. The reaction may take place either at target 115, at substrate 110, or during transit of the sputtered material in processing chamber 105.

In an embodiment, substrate holder 125 is electrically isolated from chamber 105 and associated structures, such as a chamber shield or surrounding shielding (e.g., laterally adjacent and/or otherwise positioned relative to substrate holder 125), as would be understood by one of ordinary skill in the art. In an embodiment, the temperature of substrate 120 is maintained at less than 150° C. during the deposition process.

Control system 150 is configured to monitor one or more deposition system variables and to adjust at least one system variable to maintain the variable to facilitate the deposition. Control system 150 may include one or more control computers (e.g., one or more programmable logic controllers (PLCs) and/or other types of logic devices) to analyze, control, and respond to data pertaining to the deposition process. Control system 150 may store data for later use or analysis, and control system 150 may also perform simple or complex calculations needed to facilitate monitoring and/or control of the deposition process. Further, control system 150 may be configured to control one or more components of system 100. Control system 150 may be configured to receive one or more signals indicative of a deposition process variable. These signals may include data indicative of chamber pressure, partial pressure of gas, temperature, voltage levels (and/or current), gas flow, gas concentration, and/or any other environmental condition within processing chamber 105. Further, control system 150 may be configured to effect changes in a deposition process based on the one or more variables. In one embodiment, control system 150 may provide closed-loop feedback control based on an output of system 100.

One issue in reactive sputtering processes is target poisoning. In reactive sputtering, the deposited film is formed by chemical reaction between the target material and a gas which is introduced into the chamber. The composition of the film can be controlled by varying the relative pressures of the sputter and reactive gases.

Target poisoning occurs when the reactive gas reacts not only with the particles being sputtered from the target, but with the target surface as well. As the reaction on the target takes place, the behavior of the target changes from being representative of the original target to being more representative of the compound being formed in the reaction.

In the embodiment shown in FIG. 1, control system 150 is configured to receive a voltage and/or current from target 115. The voltage at target 115 yields data related to the level of target poisoning in target 115, e.g., the amount of oxidation at target 115. The voltage is supplied to control system 150 as an input signal, and control system 150 processes the signal into a regulating signal. The regulating signal, in turn, is supplied to, for example, reactive gas flow controller 140 to regulate the flow of reactive gas and/or to sputter gas flow controller 135 to regulate the flow of sputter gas. In various embodiments, a target voltage/current monitor and/or a plasma emission spectrum analyzer (PESA) are connected to (or part of) control system 150 to allow feedback from the monitor and/or PSA to control reactive gas flow controller 140 and/or sputter gas flow controller 135. The flow of reactive gas and/or sputter gas is thus metered according to a desired range of target voltage which may provide feedback useful to aid in providing a uniform deposition.

In other embodiments, control system 150 monitors the partial pressure of the reactive gas to develop a signal for regulating the reactive gas controller 140 and/or sputter gas flow controller 135 to maintain a constant partial pressure of the reactive gas and/or sputter gas relative to the inert atmosphere in processing chamber 105. In one embodiment, a deposition rate monitor and/or a residual gas analyzer (RFA) are connected to control (or part of) system 150 to allow feedback from the monitor and/or RFA.

Figure 2:
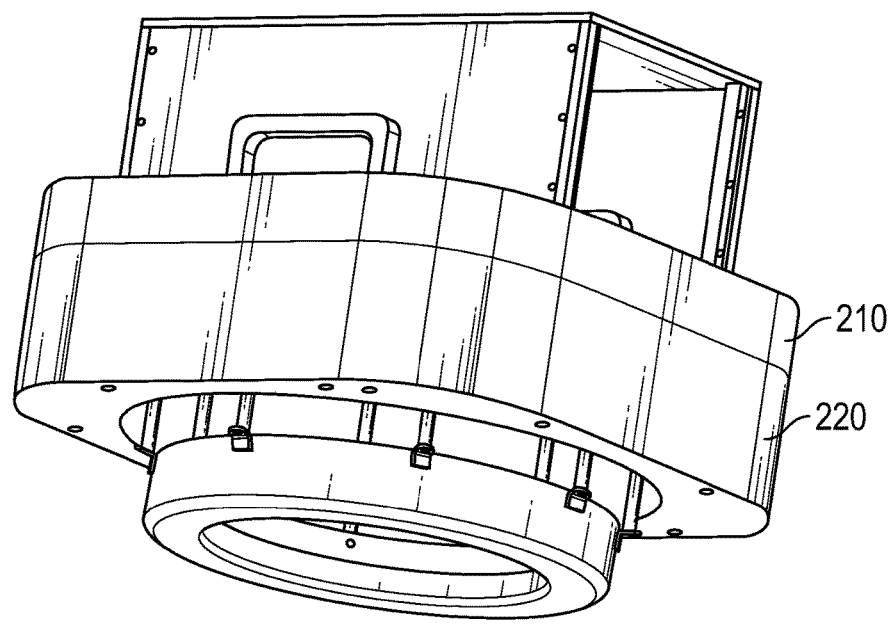
FIG. 2 illustrates two plates configured to adjust the distance between a target and substrate in accordance with embodiments of the present disclosure.

The distance between target 115 and substrate 120 may be controlled, for example, which may improve uniformity of the film. In one embodiment, plates 210 and 220 as seen in FIG. 2 are utilized to control the distance. The plates can be adjusted to modify the distance according to specific uniformity needs for a desired application. In various embodiments, the distance between plates 210, 220 is, for example about 40 mm to 125 mm, (e.g., with 13 mm increments).

Figure 3:
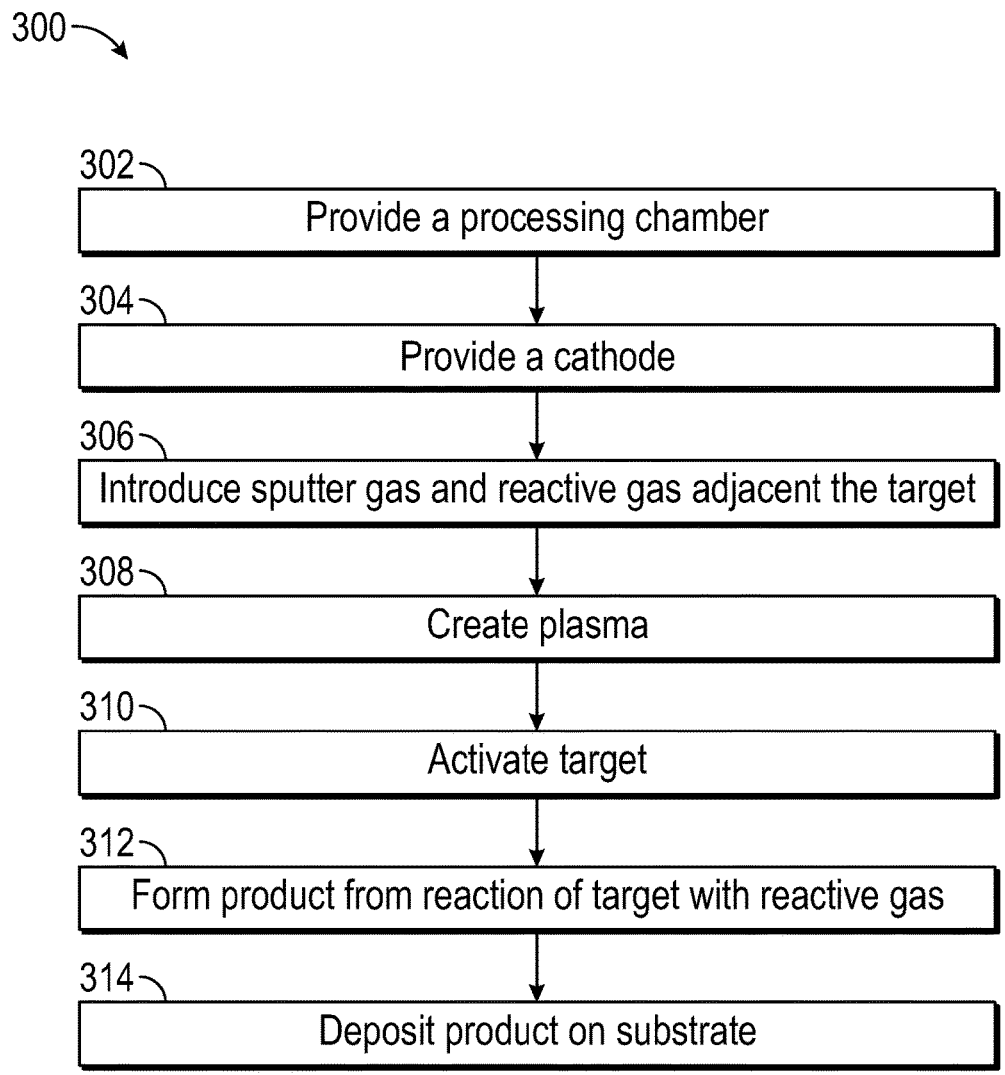
FIG. 3 illustrates a flowchart showing a method of depositing a film on a substrate in accordance with an embodiment of the present disclosure.

In accordance with an embodiment, FIG. 3 shows a flow diagram illustrating a method 300 for a deposition process, which may provide a more uniform sputtering film. Different uniformities may be achieved at different points of the substrate with different process variables as disclosed herein.

At block 302, a processing chamber is provided. At block 304, a cathode is provided within the chamber and in close proximity to a target. In one embodiment, the target is mounted on the cathode.

At block 306, a sputter gas and a reactive gas are introduced into the chamber and adjacent to the target. In one embodiment, the sputter gas and reactive gas are mixed together before they are introduced into the chamber. In another embodiment, they are introduced separately (e.g., prior to the cathode 110). Typical sputter gases are inert gases including argon (Ar), neon (Ne), krypton (Kr), xenon (Xe), and mixtures thereof. Examples of reactive gases include oxygen ($O_2$) or nitrogen ($N_2$) gas. Controlling the reactive gas so that it is introduced adjacent to target 115 confines the reaction of target atoms with reactive gas to areas in close proximity to the target. This location of the reactive gas provides for improved control and repeatability of reactive sputtering depositions, which may result in more uniform films.

At block 308, a plasma at the target is created. A plasma is a partially ionized gas consisting of positively charged particles (cations), negatively charged particles (electrons and anions), and neutrals. In a DC diode sputtering process, the ionization of the gas generally occurs between a cathode and an anode, with a voltage delivered across the sputter gas to form the plasma. The cathode, which is the electron emitter, typically holds the target material. The anode, which is the electron receiver, is usually the chamber wall or the substrate. The strong electric field between the target/cathode and the anode ionizes the sputter gas to form a plasma. In certain embodiments, the voltage at the target is controlled during the deposition process via a feedback loop. Alternatively, in RF sputtering, an RF field is used and controlled to create the plasma.

At block 310, the target is activated by the plasma, which causes particles to be emitted from the target. The particles generated in the plasma are accelerated toward the target. The particles physically dislodge (sputter) atoms from the target. The sputtered atoms then react with the reactive gas at block 312, and the reaction product migrates to the substrate surface.

At block 314, the reaction product condenses and forms a thin film on the substrate surface. The substrate is typically moved relative to the target so that the substrate may be completely covered with reaction product. Any excess material can then be removed from the chamber by a pump.

In one embodiment, the reaction product includes a vanadium oxide. Vanadium exhibits multiple oxidation states. For example, the reaction product may form $VO_x$ based films where x varies from 1-3, with 1.8 being a typical value, or the reaction product may include $V_2O_{(5-y)}$, where y is between 0 and 3. In another embodiment, the reaction product forms transition metal doped vanadium oxide films, such as the tungsten doped film $W_{(x)}V_{(2-x)}O_{(5-y)}$, where x is from 0-1 and y is from 0-3. The films may also be deposited reactively.

It is noted that additional processes may be provided before, during, and after the method 300, and that some other processes may only be briefly described herein.

Figure 4:
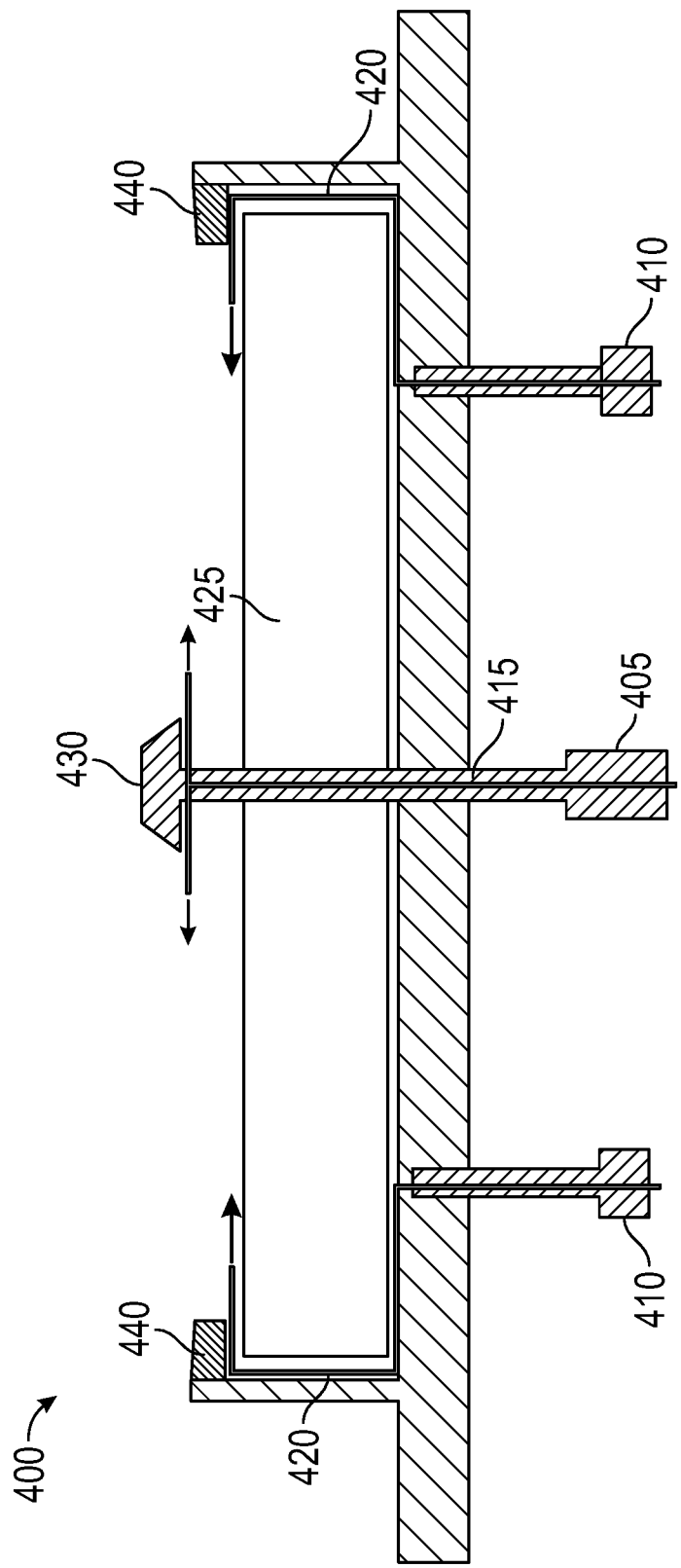
FIG. 4 illustrates a cross-sectional diagram of a device in accordance with embodiments of the present disclosure.

Referring now to FIG. 4, a diagram of one embodiment of a cathode 400 according to the present disclosure is illustrated. Cathode 400 includes gas inlets 405, 410, gas channels 415, 420, target 425, center deflector shield 430, and side deflector shields 440. Gas inlets 405, 410 are operatively associated with gas channels 415, 420 to deliver a sputter gas and a reactive gas adjacent side and center surfaces of target 425. Deflector shields 430, 440 redirect the gas so that it stays in close proximity to target 425.

Gas inlets 405, 410 are mechanically coupled to a sputter gas supply and/or a reactive gas supply. Gas inlets 405, 410 may receive individual gases or a mixture of gases. For instance, center gas inlet 405 and side gas inlets 410 may be configured to receive either a reactive gas or a sputter gas or a reactive gas and sputter gas mixture. It should be understood that although only three gas inlets are shown, more than three inlets may be incorporated into cathode 400 and at different places than those shown in FIG. 4.

Gas channels 415, 420 are operatively associated with gas inlets 405, 410 and distribute the sputter gas and reactive gas to target 425. Target 425 may be held in place by clamps. As seen in FIG. 4, center gas channel 415 receives gas from center gas inlet 405 and delivers the gas to the center surface of target 425. Center deflector shield 430 and side deflector shields 440 prevent the gas from moving too far away from target 425, and redirect gas flow towards target 425. Side gas channels 420 receive gas from side gas inlet 410, and deliver gas to the side surfaces of target 425. The arrows in FIG. 4 indicate movement of the gas. In this way, the gases and plasma are kept adjacent to target 425, and the reaction of target particles with gas is confined to target 425.

Figure 5:
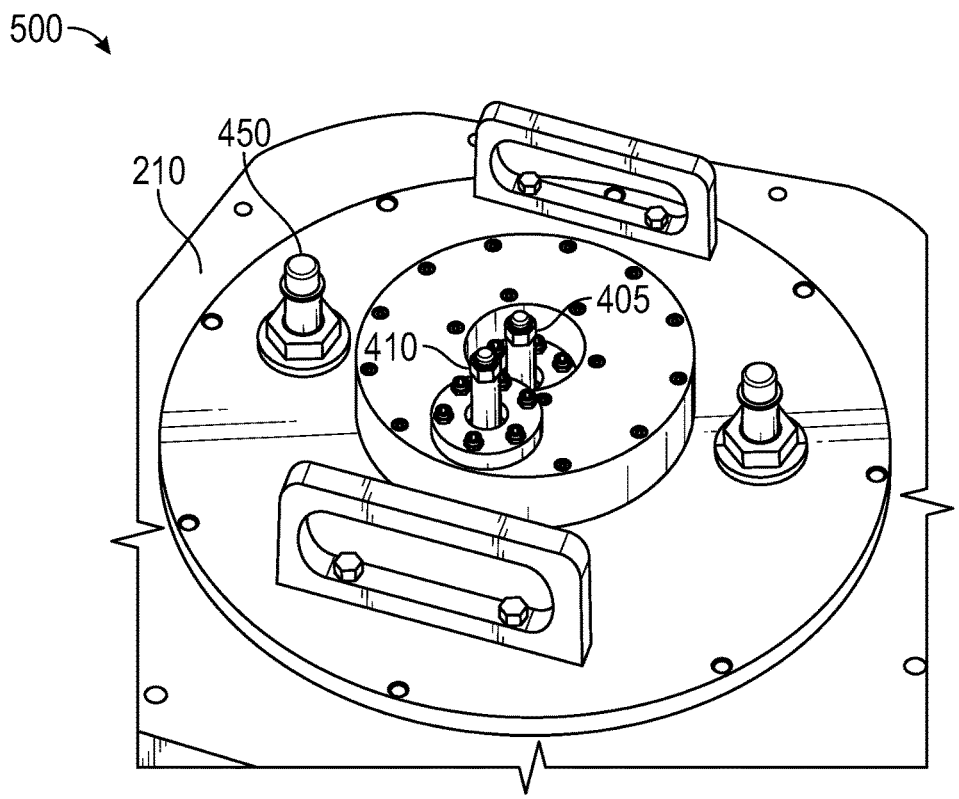
FIG. 5 illustrates a top view of a device in accordance with embodiments of the present disclosure.

FIG. 5 illustrates a top view of a cathode 500, e.g., an embodiment of cathode 110 and/or cathode 400. Gas inlets 405, 410 are shown, as well as water tubes 450. Water tubes 450 circulate water around cathode 500 to remove heat. Also shown is plate 210.

In an exemplary embodiment, the deposited film is used as the active sensor material in bolometers. The deposited film can be a temperature sensitive resistive material, such as vanadium oxide, that is used to detect infrared radiation. The bolometer operates on the principle that the electrical resistance of the bolometer material changes with respect to the bolometer temperature, which in turn changes in response to the quantity of absorbed incident infrared radiation. These characteristics can be exploited to measure incident infrared radiation on the bolometer by sensing the resulting change in its resistance. When used as an infrared detector, the bolometer is generally thermally isolated from its supporting substrate or surroundings to allow the absorbed incident infrared radiation to generate a temperature change in the bolometer material.

Microbolometer arrays are typically fabricated on monolithic silicon substrates or integrated circuits by constructing two-dimensional arrays of closely spaced air bridge structures coated with a thin film. The air bridge structure provides thermal isolation between the microbolometer detector and the silicon substrate.

With each microbolometer functioning as a pixel within the array, a two-dimensional image or picture representation of the incident radiation can be generated by translating the changes in resistance of each microbolometer into a time-multiplexed electrical signal that can be displayed on a monitor or stored in a memory. The circuitry used to perform this translation is commonly known as the read out integrated circuit (ROIC), and may be fabricated as an integrated circuit in the silicon substrate. The microbolometer array may then be fabricated on top of the ROIC. The combination of the ROIC and microbolometer array is commonly known as a microbolometer infrared focal plane array (FPA).

Figure 6:
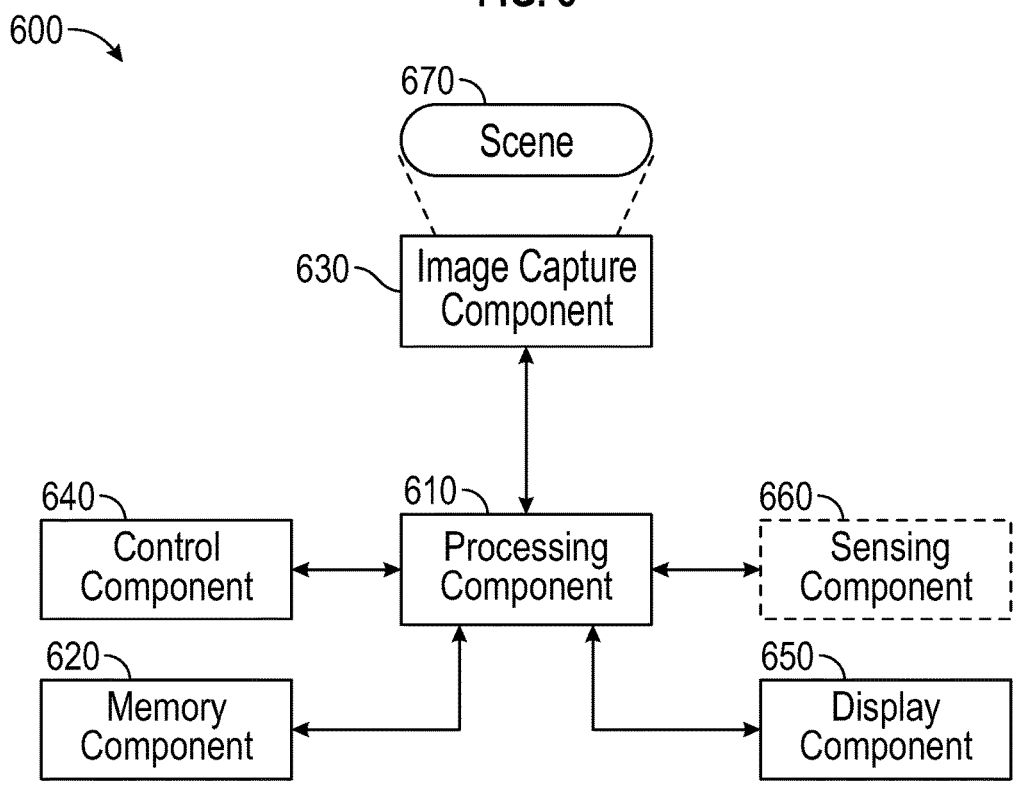
FIG. 6 illustrates a block diagram of a system for capturing images in accordance with an embodiment of the present disclosure.

Referring now to FIG. 6, a block diagram is shown illustrating a system 600 (e.g., an infrared camera) for capturing images and processing in accordance with one or more embodiments. System 600 comprises, in one implementation, a processing component 610, a memory component 620, an image capture component 630, a control component 640, and/or a display component 650. System 600 may further include a sensing component 660.

System 600 may represent for example an infrared imaging device to capture and process images, such as video images of a scene 670. The system 600 may represent any type of infrared camera adapted to detect infrared radiation and provide representative data and information (e.g., infrared image data of a scene) or may represent more generally any type of electro-optical sensor system. In one example, system 600 may represent an infrared camera, a dual band imager such as a night vision imager that operates to sense reflected visible and/or SWIR light for high resolution images and LWIR radiation for thermal imaging, or an imager for sensing both short wave and long wave radiation simultaneously for providing independent image information. System 600 may comprise a portable device and may be incorporated, e.g., into a vehicle (e.g., an automobile or other type of land-based vehicle, an aircraft, a marine craft, or a spacecraft) or a non-mobile installation requiring infrared images to be stored and/or displayed and may comprise a distributed networked system.

In various embodiments, processing component 610 may comprise any type of a processor or a logic device (e.g., a programmable logic device (PLD) configured to perform processing functions). Processing component 610 may be adapted to interface and communicate with components 620, 630, 640, and 650 to perform method and processing steps and/or operations, as described herein, including conventional system processing functions as would be understood by one skilled in the art.

Memory component 620 comprises, in one embodiment, one or more memory devices adapted to store data and information, including for example infrared data and information. Memory device 620 may comprise one or more various types of memory devices including volatile and non-volatile memory devices, and/or a machine-readable medium capable of storing data in a machine-readable format. Processing component 610 may be adapted to execute software stored in memory component 620 so as to perform method and process steps and/or operations described herein.

Image capture component 630 comprises, in one embodiment, any type of image sensor, such as for example one or more infrared sensors (e.g., any type of multi-pixel infrared detector, such as microbolometer detectors and focal plane arrays) for capturing infrared image data (e.g., still image data and/or video data) representative of an image, such as scene 670. In an exemplary embodiment, image capture component 630 comprises a vanadium oxide film deposited by the methods, systems, and/or devices described herein. In one implementation, the infrared sensors of image capture component 630 provide for representing (e.g., converting) the captured image data as digital data (e.g., via an analog-to-digital converter included as part of the infrared sensor or separate from the infrared sensor as part of system 700). In one aspect, the infrared image data (e.g., infrared video data) may comprise non-uniform data (e.g., real image data) of an image, such as scene 670. Processing component 610 may be adapted to process the infrared image data (e.g., to provide processed image data), store the infrared image data in memory component 620, and/or retrieve stored infrared image data from memory component 620. For example, processing component 610 may be adapted to process infrared image data stored in memory component 620 to provide processed image data and information (e.g., captured and/or processed infrared image data).

Control component 640 comprises, in one embodiment, a user input and/or interface device. For example, the user input and/or interface device may represent a rotatable knob (e.g., potentiometer), push buttons, slide bar, keyboard, etc., that is adapted to generate a user input control signal. Processing component 610 may be adapted to sense control input signals from a user via control component 640 and respond to any sensed control input signals received therefrom. Processing component 610 may be adapted to interpret such a control input signal as a parameter value, as generally understood by one skilled in the art.

In one embodiment, control component 640 may comprise a control unit (e.g., a wired or wireless handheld control unit) having push buttons adapted to interface with a user and receive user input control values. In one implementation, the push buttons of the control unit may be used to control various functions of the system 600, such as autofocus, menu enable and selection, field of view, brightness, contrast, noise filtering, high pass filtering, low pass filtering, and/or various other features as understood by one skilled in the art.

Display component 650 comprises, in one embodiment, an image display device (e.g., a liquid crystal display (LCD) or various other types of generally known video displays or monitors). Processing component 610 may be adapted to display image data and information on the display component 650. Processing component 610 may be adapted to retrieve image data and information from memory component 620 and display any retrieved image data and information on display component 650. Display component 650 may comprise display electronics, which may be utilized by processing component 610 to display image data and information (e.g., infrared images). Display component 650 may be adapted to receive image data and information directly from image capture component 630 via the processing component 610, or the image data and information may be transferred from memory component 620 via processing component 610.

Sensing component 660 comprises, in one embodiment, one or more sensors of various types, depending on the application or implementation requirements, as would be understood by one skilled in the art. The sensors of optional sensing component 660 provide data and/or information to at least processing component 610. In one aspect, processing component 610 may be adapted to communicate with sensing component 660 (e.g., by receiving sensor information from sensing component 660) and with image capture component 630 (e.g., by receiving data and information from image capture component 630 and providing and/or receiving command, control, and/or other information to and/or from one or more other components of system 600).

In various implementations, sensing component 660 may provide information regarding environmental conditions, such as outside temperature, lighting conditions (e.g., day, night, dusk, and/or dawn), humidity level, specific weather conditions (e.g., sun, rain, and/or snow), distance (e.g., laser rangefinder), and/or whether a tunnel or other type of enclosure has been entered or exited. Sensing component 660 may represent conventional sensors as generally known by one skilled in the art for monitoring various conditions (e.g., environmental conditions) that may have an effect (e.g., on the image appearance) on the data provided by image capture component 630.

In some implementations, optional sensing component 660 (e.g., one or more of sensors) may comprise devices that relay information to processing component 610 via wired and/or wireless communication. For example, optional sensing component 660 may be adapted to receive information from a satellite, through a local broadcast (e.g., RF) transmission, through a mobile or cellular network and/or through information beacons in an infrastructure (e.g., a transportation or highway information beacon infrastructure), or various other wired and/or wireless techniques.

In various embodiments, components of system 600 may be combined and/or implemented or not, as desired or depending on the application or requirements, with system 600 representing various functional blocks of a related system. In one example, processing component 610 may be combined with memory component 620, image capture component 630, display component 650, and/or optional sensing component 660. In another example, processing component 610 may be combined with image capture component 630 with only certain functions of processing component 610 performed by circuitry (e.g., a processor, a microprocessor, a logic device, a microcontroller, etc.) within image capture component 630. Furthermore, various components of system 600 may be remote from each other (e.g., image capture component 630 may comprise a remote sensor with processing component 610, etc. representing a computer that may or may not be in communication with image capture component 630).

In view of the present disclosure, it will be appreciated that apparatus, systems, and methods as set forth herein advantageously may provide films for microbolometer detectors with increased uniformity and reproducibility. The mixture of gases injected into the plasma may result in the formation of an alloy in close proximity to or on the target, which can significantly provide better uniformity and control of the method.

It is understood that this disclosure provides many different embodiments, or examples, for implementing different features of the invention. Specific examples of components and arrangements are described herein to simplify the present disclosure. These are, of course, merely examples and are not intended to be limiting. Various features may be arbitrarily drawn in different scales for the sake of simplicity and clarity.

Embodiments described above illustrate but do not limit the disclosure. It should also be understood that numerous modifications and variations are possible in accordance with the principles of the present disclosure. Accordingly, the scope of the disclosure is defined only by the following claims.

What is claimed as new and desired to be protected is:

1. A system, comprising:
a processing chamber for a deposition process;
a cathode within the chamber, wherein the cathode comprises gas inlets to receive a sputter gas and a reactive gas and gas channels operatively associated with the gas inlets to deliver the sputter gas and the reactive gas adjacent to a target, wherein the gas channels comprise a center gas channel and two or more side gas channels configured to deliver the sputter gas and/or the reactive gas from gas channel openings at a center surface and two or more side surfaces of the target for the deposition process;
a substrate holder, disposed opposite the cathode within the processing chamber, configured to secure a substrate to receive a deposition from the target, wherein the substrate holder is electrically isolated from the processing chamber and surrounding shielding of the substrate holder; and
a control system configured to monitor a target voltage and to control a flow rate of the reactive gas to maintain the target voltage within a desired range during the deposition process.

2. The system of claim 1, wherein the cathode is configured to hold the target during the deposition process, and wherein the center gas channel is configured to be disposed through a central portion of the target and configured to deliver the sputter gas and/or the reactive gas at the center surface of the target.

3. The system of claim 1, wherein the control system provides closed-loop feedback control of the target voltage and the flow rate of the reactive gas, and further comprising a magnet disposed proximate to the target and configured to generate a magnetic field.

4. The system of claim 1, wherein the control system controls a partial pressure of the reactive gas in the processing chamber.

5. The system of claim 1, further comprising plates configured to adjust a distance between the target and the substrate to provide a uniformity of the deposition onto the substrate.

6. The system of claim 1, wherein the target comprises vanadium, the sputter gas comprises argon, and the reactive gas comprises oxygen, wherein the cathode comprises a magnet, and wherein the control system applies a DC pulsed voltage to the cathode, and further comprising one or more deflector shields coupled to each of the center gas channel and the two or more side gas channels configured to redirect gas towards the target.

7. The system of claim 6, wherein the substrate comprises an infrared sensor for a bolometer, and further comprising the gas inlets configured to receive a mixture of the sputter gas and/or the reactive gas, wherein the gas inlets comprise a center gas inlet and two or more side gas inlets.

8. The system of claim 1, wherein the substrate holder is at a different electrical potential than the cathode, and wherein the system maintains a temperature of the substrate at less than 150 degrees Celsius during the deposition process.

9. A cathode configured to hold a target for a deposition process, the cathode comprising:
two or more side gas channels and a center gas channel configured to deliver a sputter gas and/or a reactive gas from gas channel openings at two or more side surfaces and a center surface of the target, wherein the center gas channel is configured to be disposed through a central portion of the target and configured to deliver the sputter gas and/or the reactive gas at the center surface of the target.

10. The cathode of claim 9, further comprising gas inlets, wherein the gas inlets comprise a center gas inlet coupled to the center gas channel and two or more side gas inlets coupled to the two or more side gas channels, and wherein a flow of the sputter gas and/or the reactive gas supplied to the gas inlets is regulated by a control system.

11. The cathode of claim 9, further comprising a clamp configured to secure the target to the cathode and a magnet to generate a magnetic field.

12. The cathode of claim 9, further comprising one or more deflector shields coupled to each of the two or more side gas channels and the center gas channel openings to redirect gas towards the target.

13. A method of using the system of claim 1, the method comprising:
introducing via the cathode within the processing chamber the sputter gas and/or the reactive gas adjacent the target, wherein the cathode is in close proximity to the target;
delivering the sputter gas and/or the reactive gas at the two or more side surfaces and the center surface of the target;
creating a plasma at the target;
activating the target, causing target particles to be emitted from the target;
forming a product from a reaction of target particles with the reactive gas;
depositing the product on the substrate secured to the substrate holder; and
electrically isolating the substrate holder from the processing chamber and surrounding shielding of the substrate holder.

14. The method of claim 13, wherein the sputter gas comprises argon, the reactive gas comprises oxygen, and the target comprises vanadium, wherein the cathode comprises a magnet configured to generate a magnetic field, and wherein the creating a plasma at the target further comprises providing a DC pulsed voltage to the cathode.

15. The method of claim 13, wherein the sputter gas and the reactive gas are introduced to the target as a mixture.

16. The method of claim 13, further comprising monitoring the target voltage and/or partial pressure of the reactive gas.

17. The method of claim 16, further comprising controlling the flow rate of the reactive gas into the processing chamber.

18. The method of claim 13, further comprising adjusting a distance between the target and the substrate.

19. The method of claim 13, further comprising incorporating the substrate in an infrared camera to provide a bolometer array.

20. The method of claim 13, wherein the target comprises vanadium and/or a transition metal doped vanadium oxide.

21. The method of claim 13, wherein the product comprises vanadium oxide; vanadium oxide ($VO_x$), where x is in a range of 1 to 3; vanadium oxide ($V_2O_{(5-y)}$), where y is in a range of 0 to 3; or tungsten doped vanadium oxide ($W_xV_{(2-x)}O_{(5-y)}$), where x is in a range of 0 to 1 and y is in a range of 0 to 3.

22. The method of claim 13, further comprising maintaining the substrate at a temperature of less than 150° C. during the depositing of the product on the substrate.

\* \* \* \* \*